United States Patent
Baldwin et al.

(10) Patent No.: US 9,853,104 B2
(45) Date of Patent: Dec. 26, 2017

(54) HYDROGENATED GRAPHENE WITH SURFACE DOPING AND BANDGAP TUNABILITY

(71) Applicant: The United States of America, as represented by the Secretary of the Navy, Arlington, VA (US)

(72) Inventors: Jeffrey W. Baldwin, Fairfax, VA (US); Bernard R. Matis, Alexandria, VA (US); James S. Burgess, Nashua, NH (US); Felipe Bulat-Jara, Washington, DC (US); Adam L. Friedman, Silver Springs, MD (US); Brian H. Houston, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 36 days.

(21) Appl. No.: 15/091,800

(22) Filed: Apr. 6, 2016

(65) Prior Publication Data

US 2016/0218184 A1    Jul. 28, 2016

Related U.S. Application Data

(63) Continuation of application No. 13/942,257, filed on Jul. 15, 2013, now Pat. No. 9,312,130.
(Continued)

(51) Int. Cl.
*H01L 29/16*    (2006.01)
*H01L 21/02*    (2006.01)
(Continued)

(52) U.S. Cl.
CPC .......... *H01L 29/1606* (2013.01); *H01B 5/14* (2013.01); *H01B 13/30* (2013.01);
(Continued)

(58) Field of Classification Search
CPC ............. H01L 29/1606; H01L 21/3003; H01L 21/02381; H01L 21/02488;
(Continued)

(56) References Cited

U.S. PATENT DOCUMENTS

2011/0127638 A1*    6/2011    Brenner ................. B82Y 10/00
257/607

OTHER PUBLICATIONS

Burgess, J., S. et al.; Tuning the electronic properties of graphene by hydrogenation in a plasma enhanced chemical vapor deposition reactor. Carbon 49, 4420-4426 (2011).*
(Continued)

*Primary Examiner* — John P Dulka
(74) *Attorney, Agent, or Firm* — US Naval Research Laboratory; Stephen T. Hunnius

(57) ABSTRACT

A graphene compound made from the method of preparing graphene flakes or chemical vapor deposition grown graphene films on a $SiO_2$/Si substrate; exposing the graphene flakes or the chemical vapor deposition grown graphene film to hydrogen plasma; performing hydrogenation of the graphene; wherein the hydrogenated graphene has a majority carrier type; creating a bandgap from the hydrogenation of the graphene; applying an electric field to the hydrogenated graphene; and tuning the bandgap.

3 Claims, 4 Drawing Sheets

Related U.S. Application Data

(60) Provisional application No. 61/701,029, filed on Sep. 14, 2012.

(51) Int. Cl.
*H01B 13/30* (2006.01)
*H01B 5/14* (2006.01)
*H01L 21/30* (2006.01)
*H01L 21/223* (2006.01)

(52) U.S. Cl.
CPC .. *H01L 21/02381* (2013.01); *H01L 21/02488* (2013.01); *H01L 21/02518* (2013.01); *H01L 21/02527* (2013.01); *H01L 21/02664* (2013.01); *H01L 21/3003* (2013.01); *H01L 21/2236* (2013.01)

(58) Field of Classification Search
CPC ......... H01L 21/02527; H01L 21/02518; H01L 21/02664; H01B 5/14; H01B 13/30
See application file for complete search history.

(56) References Cited

OTHER PUBLICATIONS

Matis, B. R., et al.; Surface Doping and Bandgap Tunability in Hydrogenated Graphene. Published online at Nano Letters (2011).*

* cited by examiner

HYDROGENATED GRAPHENE WITH SURFACE DOPING AND BANDGAP TUNABILITY

REFERENCE TO RELATED APPLICATION

This application claims priority to and the benefits of U.S. Provisional Patent Application 61/701,029 filed on Sep. 14, 2012, and U.S. patent application Ser. No. 13/942,257 filed on Jul. 15, 2013, the entirety of each is herein incorporated by reference.

BACKGROUND

This disclosure provides a method for introducing a bandgap in single layer graphite (graphene) on a $SiO_2$ substrate, while also allowing for independent control of the majority carrier type via surface adsorbates. Specific applications of the invention include patterning graphene samples for nanocircuit design and device integration at various scales, for example, p-n junctions. The technique is reversible, such that the dopant atoms introduced into the graphene can be removed while preserving the original graphene band structure.

SUMMARY OF DISCLOSURE

The addition of hydrogen to the 2-dimensional material graphene results in considerable changes to the electrical properties of the film, namely the conversion from a semi-metallic behavior to a semi-insulating behavior. We have demonstrated the temperature dependence of the resistivity of chemical vapor deposition (CVD) grown graphene upon hydrogenation in a plasma enhanced chemical vapor deposition (PECVD) reactor, where we have electrically observed a bandgap opening in hydrogenated graphene, and have shown that at 0 $V_g$ the bandgap is higher for higher hydrogen to carbon (H/C) ratios.

Additionally, we have demonstrated that hydrogenated graphene on a $SiO_2$ substrate is an n-type material when it is free of adsorbates. Furthermore, we have demonstrated the ability to tune the bandgap opening.

And, we have demonstrated the capability to convert the majority charge carrier from electrons to holes using surface adsorbates such as water. Still furthermore, we have demonstrated that in the temperature regime 220 K-375 K the bandgap of hydrogenated graphene has a maximum value at the charge neutrality point (CNP), is tunable with an electric field effect, and is higher for higher H/C ratios.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

Figure 1:
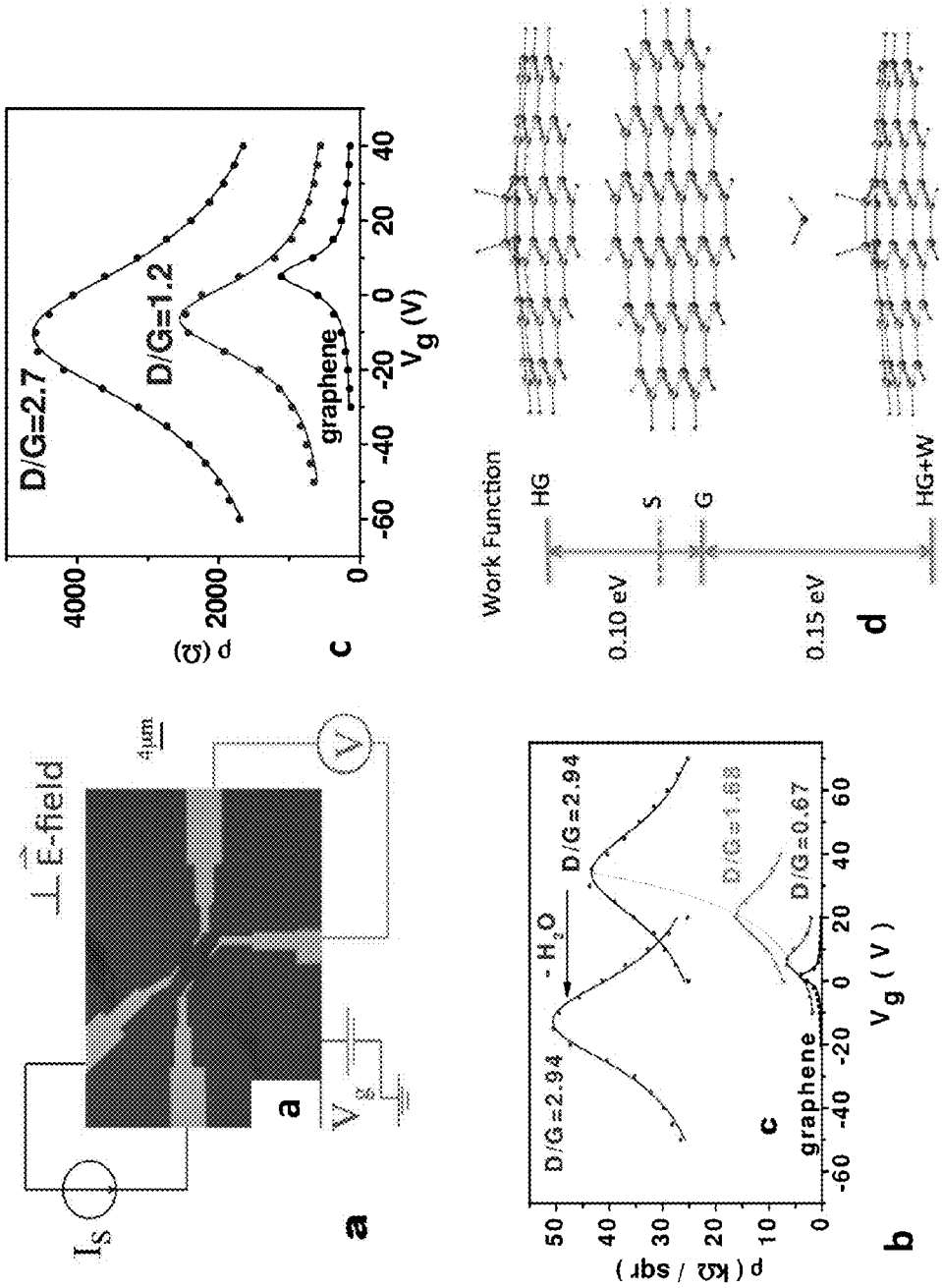
FIG. 1 illustrates Shift of the CNP and maximum resistivity ($r_{max}$) with surface doping. (a) Optical image of a typical graphene device and electrical schematic. (b) r at 296 K as a function of $V_g$ for graphene sample G-X1 (black trace) and three separate levels of hydrogenation (red, green, and blue traces) with water adsorbates. The solid curves are Lorentzian fits to the data. The dashed line is a guide to the eye. Purple trace: r versus $V_g$ at 296 K for the D/G of 2.94 after heating to 375 K (HG-X1). The shift of the CNP to negative $V_g$ demonstrates the conversion of the majority carrier type from p to n. (c) r versus $V_g$ at 295K for graphene sample G-Hb (black trace) and two separate levels of hydrogenation (red and blue curves) without water adsorbates. (d) Relative work functions of the graphene (G) (center), $SiO_2$ surface (S), hydrogenated graphene (HG) (top), and hydrogenated graphene with water adsorbates (HG+W) (bottom).

We report the first observation of the n-type nature of hydrogenated graphene on $SiO_2$ and demonstrate the conversion of the majority carrier type from electrons to holes using surface doping. Density functional calculations indicate that the carrier type reversal is directly related to the magnitude of the hydrogenated graphene's work function relative to the substrate, which decreases when adsorbates such as water are present. Additionally, we show by temperature dependent electronic transport measurements that hydrogenating graphene induces a bandgap, and that in the moderate temperature regime [220 K-375 K], the bandgap has a maximum value at the charge neutrality point (CNP), is tunable with an electric field effect, and is higher for higher hydrogen coverage. The ability to control the majority charge carrier in hydrogenated graphene, in addition to opening a bandgap, suggests potential for chemically modified graphene p-n junctions.

Exfoliated graphene flakes and CVD grown graphene films were prepared on a $SiO_2$ (275 nm)/Si (n-type arsenic doped) substrate, followed by the deposition of Cr (10 nm)/Au (50 nm) contact electrodes. Hydrogenation of the graphene was performed according to the following conditions: 15-30 W, 1.5 Torr $H_2$, 100 sccm $H_2$, 32° C., for 15-30 seconds. The hydrogenation conditions (time and power) varied depending upon the desired level of hydrogenation.

Raman spectroscopy was used to determine the relative defect densities in the films by a ratio of the G-mode intensity (1588 $cm^{-1}$, $E_{2g}$ phonon mode) and the D-mode intensity (1345 $cm^{-1}$, appearing due to symmetry breaking at defect sites). The D/G ratio is related to the defect-free domain size of graphitic materials, in this case caused by hydrogen addition to the graphene sheet. With the PECVD conditions stated, the resulting D/G ratios demonstrated saturation for each power/time and were repeatable for all devices. Raman spectra were collected using a Renishaw MicroRaman Spectrometer with a 514 nm laser excitation.

Tunability of the majority carrier type via surface doping removes the requirement for multiple gate electrodes for independent carrier type control, avoiding the need for high quality dielectrics that are difficult to grow on graphene and are susceptible to leakage currents. The additional capability of being able to introduce a bandgap in graphene materials, in parallel to controlling the majority carrier type, makes hydrogenated graphene a promising method for nanocircuit design in a graphene-based system.

Graphene lacks a bandgap in its electronic spectrum, thus graphene's conductivity cannot be turned off electronically as in conventional semiconductor materials. This hinders this unique material from replacing silicon-based electronics in logic operations. The absence of a bandgap is one of the biggest hurdles that must be overcome before graphene can be used as an electronic material for use in logic operations, and one that has sparked an intense research effort to this effect. Chemical functionalization of graphene is a promising method for tuning the material's unique band structure and majority carrier type for future electronic and optical applications.

Graphane, a recently discovered completely hydrogenated derivative of graphene, is a stable two dimensional structure in which the $sp^2$ C—C double bonds are hybridized to $sp^3$ C—C single bonds by the addition of hydrogen to the carbon lattice. Unlike graphene, which is a zero bandgap semimetal, hydrogenated exfoliated and CVD grown graphene have been shown to exhibit a strong temperature dependence ($\Delta R/\Delta T<0$) characteristic of semiconducting materials. Theoretically, the bandgap of hydrogenated graphene has been shown to depend upon the amount of H coverage on each side of the graphene film as well as the distribution and ordering of H atoms on the film, reaching values as high as 5.4 eV. Several recent experimental studies have shown that hydrogenated graphene has a bandgap. Haberer et al. have used angle-resolved photoemission spectroscopy (ARPES) to measure a bandgap in quasi-freestanding hydrogenated graphene on Au, where the size of the gap is tuned by varying the H/C ratio. Additionally, Balog et al. using ARPES have shown that hydrogen adsorbed onto the Moire superlattice positions of graphene grown on an Ir(111) substrate also induces an appreciable bandgap, which is tunable by varying the H/C ratio as well. In spite of these significant achievements, many open questions still remained as concerned graphene.

Here we show that hydrogenated graphene on $SiO_2$ is an n-type material and electrically demonstrate the ability to tune the bandgap opening. We report on the ability to convert the majority carrier type from electrons to holes using surface adsorbates such as water, which according to our density-functional theory (DFT) model is a consequence of shifting of the material's work function relative to the substrate's work function upon hydrogenation and subsequent adsorption/desorption of atmospheric water.

Furthermore, we demonstrate that in the temperature regime 220 K-375 K the bandgap has a maximum value at the charge neutrality point (CNP), is tunable with an electric field effect, and is higher for higher H/C ratios. This is the first report, to our knowledge, of the n-type nature of hydrogenated graphene on a $SiO_2$ substrate as well as the first demonstration of the complete reversibility of the majority carrier type with surface doping. The temperature dependent resistivity of hydrogenated graphene shows semiconducting behavior and is well described by the variable-range hopping model. We show that in our devices a bandgap of up to 50 meV emerges at the CNP, and that the size of the gap can be tuned by varying $V_g$ and/or the hydrogen coverage.

FIG. 1(a) is an optical micrograph of a typical graphene device and electrical schematic used in our experiments. A Van der Pauw cross (referred to here as device X1) with arm dimensions of 500 nm and 200 nm (length and width respectively) which was characterized before (G-X1) and after hydrogenation (HG-X1). FIG. 1(b) shows ρ versus $V_g$ at 295 K for HG-X 1+W (+W for "with adsorbed water") and illustrates both the increase in ρ and the shift in the CNP away from the pristine graphene state with increasing levels of hydrogenation, comparable to previously reported hydrogenated graphene studies. The data shown in FIG. 1(b) (with the exception of the purple trace) was intentionally taken as quickly as possible with each experiment commencing within 10 minutes of initiation of chamber evacuation ($P_o>1.0\times10^{-4}$ Torr), thus not allowing for complete removal of physisorbed water. Ambipolar behavior is still observed even for our highest D/G ratios, though ρ at the CNP is seen to increase by a factor of 11, and the CNP has shifted to the right nearly 30V. The shift of the CNP to the right, indicating a larger fraction of p-type carriers, is attributed to atmospheric water adsorbed to the hydrogenated graphene surface. Such behavior indicates that the hydrogenated graphene is doped with holes while water is adsorbed to the surface, and that the dopant level can be varied with different degrees of hydrogenation and/or surface water concentrations.

To remove the adsorbed water the sample was heated while continuously maintaining a vacuum ($P<1.0\times10^{-6}$ Torr). The purple trace in FIG. 1b shows ρ versus $V_g$ at 295 K after the device was heated to 375 K. Here, the CNP has shifted to negative $V_g$, a nearly 50 V shift, while $\rho_{max}$ was seen to change by only about 12% of its initial value. The shift of the CNP to negative $V_g$ indicates that without the presence of water on the surface, the hydrogenated graphene film has changed from p-type to n-type. Raman spectra collected after heating show that no measurable change occurs in the D/G ratio due to heating to 375 K, and we conclude that the change in hydrogen content after heating is negligible.

FIG. 1(c) shows ρ versus $V_g$ for device HG-Hb after having left the hydrogenated sample under vacuum for at least 24 hours before any electrical measurements were carried out. Consistent with the slow removal of adsorbed water in vacuum, the CNP is seen to shift to negative $V_g$ values even without heating. The data in FIG. 1(c) mirrors the symmetry seen in FIG. 1b for hydrogenated graphene with adsorbed water and definitively shows that without water adsorbed to the film's surface, the hydrogenated graphene material is increasingly n-type for increasing levels of hydrogenation.

It is surprising that although the hydrogenated film displays n-type behavior, the incorporation of water—a known electron donor—physisorbed on the surface results in a p-type material. Our DFT model indicates that this behavior is due to changes in the materials work function (WF). While graphene's WF is very close to that of the substrate (thermal oxide on silicon), evidenced by its CNP being close to 0 $V_g$, the WF of the hydrogenated material is higher, leading to an electron-enrichment of the film that accounts for our observations (n-type). Furthermore, we observe that our model predicts that the physisorption of water leads to a significant lowering of the WF well below that of graphene (and thus that of the substrate), FIG. 1(d). A film WF lower than that of the substrate's results in an electron depletion (electrons moving from the film to the substrate), resulting in a p-type material. The different type of majority carriers is thus accounted for by the WF's of the different materials relative to the substrate, and such a striking change in majority carrier should only be observed in substrates whose WF is close to that of graphene.

The WF of graphene has been measured and is almost identical to that of graphite, ~4.6 eV, very close to the reported value for a >100 nm thermal oxide layer on n-type silicon, which explains why our exfoliated graphene on a $SiO_2$ substrate always displays a CNP close to 0 $V_g$. As stated above, we performed DFT calculations to assess the effect of hydrogenation and subsequent water adsorption on the WF of graphene. For these purposes, we use a cluster model consisting of a coronene molecule using a triple-zeta Gaussian basis [6-311 G(d,p)] and the wB97XD functional as implemented in the Gaussian 09 software suite. To account for the effect of the positively charged substrate, we included an electric field in the direction perpendicular to the molecular plane. The relative changes on the WF were estimated by using the approximation WF=$-(e_{HOMO}+e_{LUMO})/2$. The WF for coronene is estimated to be 3.74 eV, and although this is about 0.9 eV lower than the experimental value for graphene, we are interested in its changes due to hydrogenation and subsequent water adsorption. The hydrogenated coronene displays a WF ~0.1 eV higher than that of coronene, while the absorption of water results in a lowering relative to coronene of ~0.15 to 0.20 eV, consistent with the discussion above. We emphasize the importance of accounting for the substrate effect through an electric field, as when no field is present the WF's for the hydrogenated graphene material with and without water are both approximately ~0.06 eV lower than that of coronene.

Figure 2:
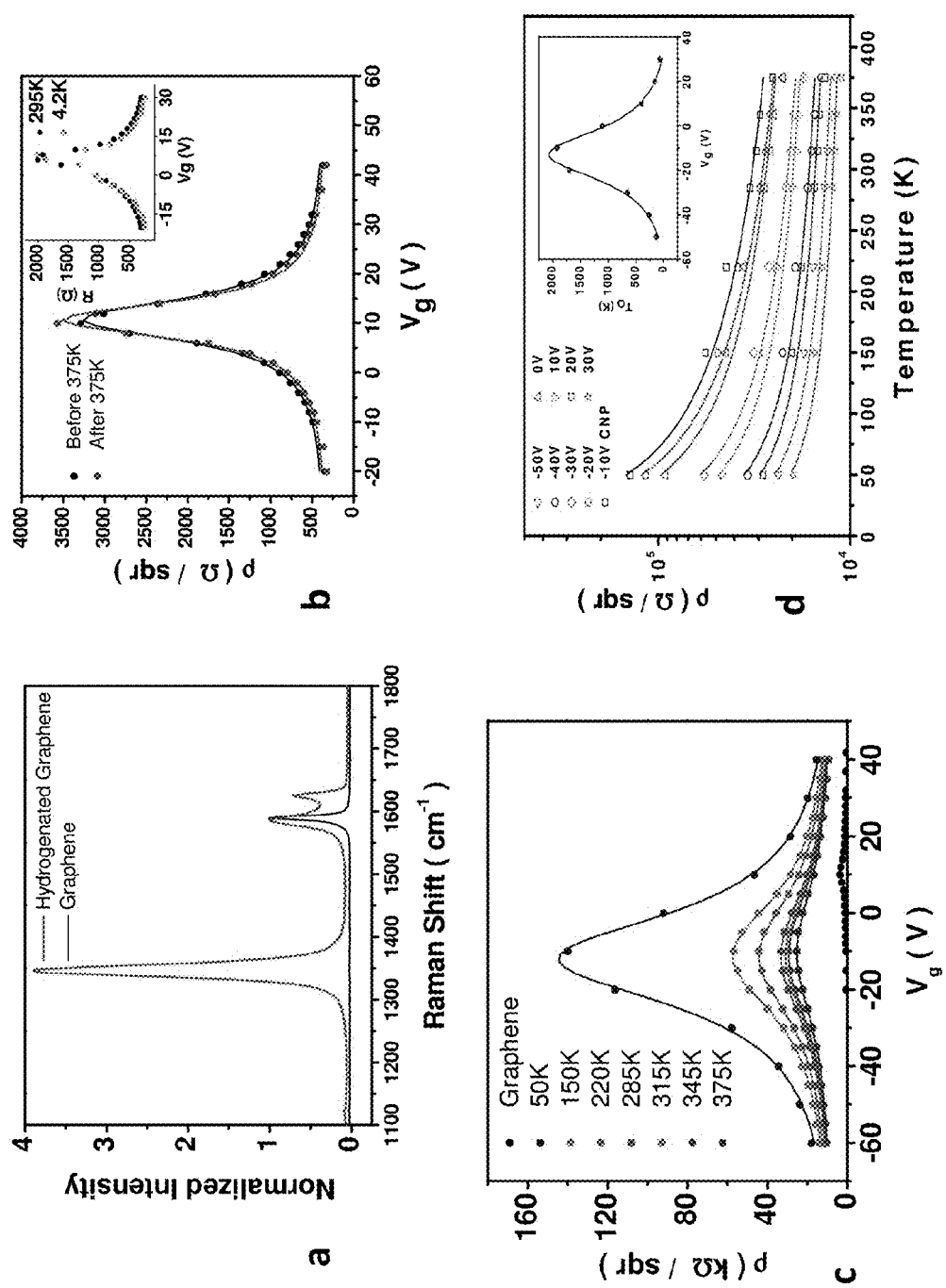
FIG. 2 illustrates Electrical properties of n-doped hydrogenated graphene. (a) Raman spectra of the graphene device (square device) in FIGS. 2b-d before (G-Sq) and after hydrogenation (HG-Sq). The spectra have been normalized to the G-mode intensity. (b) r as a function of $V_g$ at 296 K for G-Sq before heating to 375 K (black trace) and after heating (red trace). The solid curves are Lorentzian fits to the data. Inset: temperature dependence of graphene demonstrates characteristic semi-metallic properties. (c) r versus $V_g$ from 50 K to 375 K for the hydrogenated device HG-Sq with a D/G ratio of 3.9. Data was taken after pumping the chamber for 17 hours. Note that the CNP is located at negative $V_g$, indicating an n-type material. The solid lines are Lorentzian fits to the data. The graphene (black trace) was measured at room temperature. (d) r versus temperature for several different gate voltages. The solid lines are fits to the VRH theory. Inset: Characteristic exponents $T_o$, extracted from a fit to the VRH theory, versus $V_g$. The black trace is a Lorentzian fit to the data.
Figure 3:
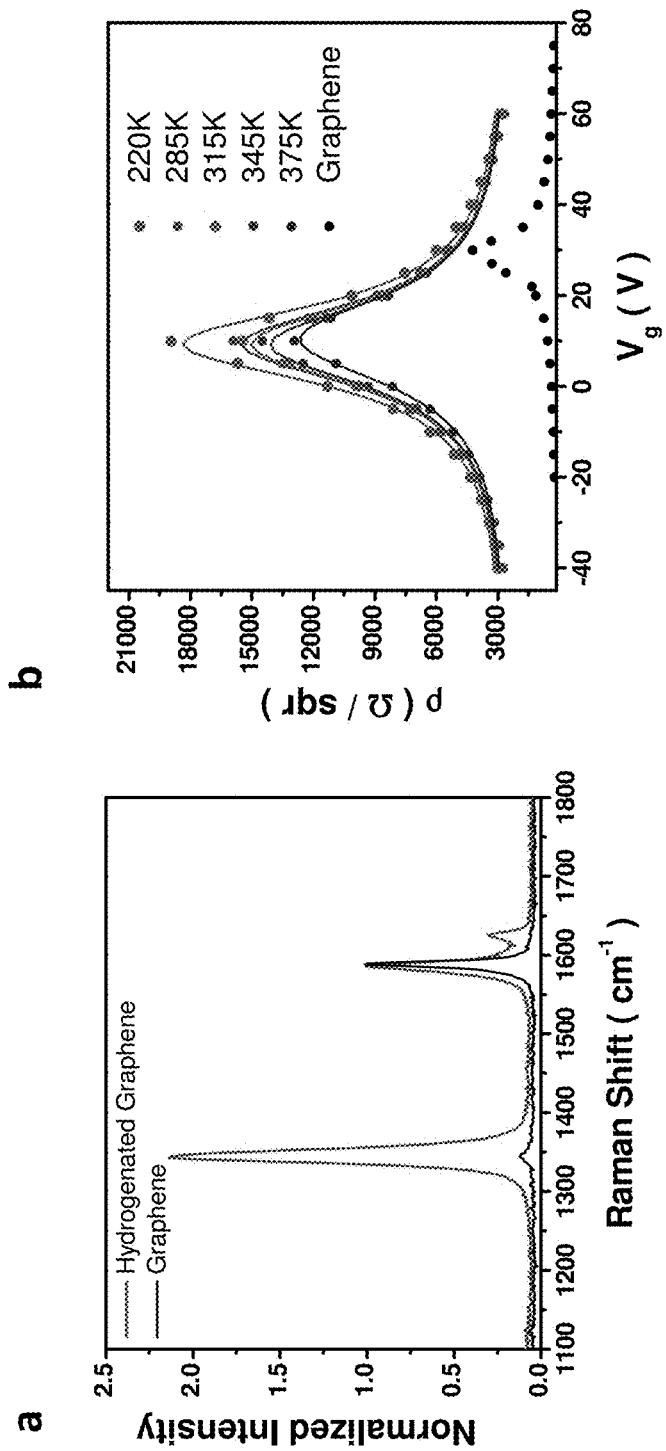
FIG. 3 illustrates Electrical properties of p-type hydrogenated graphene before conversion to n-type. (a) Raman spectra of the graphene device (cross device) in FIG. 3b before (G-X2) and after hydrogenation (HG-X2). The spectra have been normalized to the G-mode intensity. (b) r versus $V_g$ from 220 K to 375 K for the hydrogenated device HG-X2 with a D/G ratio of 2.1. Data was taken after pumping the chamber for 17 hours. Note that the CNP is to the left of the pristine graphene CNP, but to the right of 0 $V_g$. It is possible that this is due to unintentional doping of the initial graphene (CNP located at ~30V). The solid lines are Lorentzian fits to the data. The graphene (black trace) was measured at room temperature.

We further study the electronic properties of the hydrogenated graphene with several additional devices including a square geometry (referred to here as device G-Sq) shown in FIG. 1a, and a cross geometry with arm dimensions of 1.25 μm by 500 nm (length and width respectively, and referred to as device G-X2), which all demonstrate the same effect. The black traces in FIGS. 2(c) and 3(b) illustrate ρ versus $V_g$ for the graphene found at 295 K. The graphene was heated to 375 K and the CNP was determined to remain fixed in $V_g$ at 295 K with no appreciable change in the $\rho_{max}$ value as seen in FIG. 2(b). The graphene 295 K mobility $\mu_h$ (p-type, hole conduction) for the G-Sq device was measured at 0 $V_g$ and found to be 8,300 cm$^2$/Vs, while the 295 K temperature carrier density $n_h$ was found to be 9.4×10$^{11}$ cm$^{-2}$.

The two samples were hydrogenated to D/G ratios of 3.9 (HG-Sq) and 2.1 (HG-X2) and were evacuated in the cryostat for 17 hours before any electrical measurements were carried out. The CNP for both hydrogenated samples shifted ~20V to the left in $V_g$ from the CNP of the pristine graphene even without heating, as can be seen in FIG. 2c (HG-Sq) and FIG. 3(b) (HG-X2). After the CNP had shifted the mobility and carrier density were measured for the HG-Sq sample at 0 $V_g$: $\mu_e$ (n-type, electron conduction)=307 cm$^2$/Vs and $n_e$=7.4×10$^{11}$ cm$^{-2}$.

The samples were heated to 375 K though no appreciable change was observed in the location of the CNP. Thus we conclude that the majority of the water on the surface was desorbed during the extended time in vacuum. Together with the small changes in D/G ratios before and after the measurements and heating cycles, these observations indicate that the shift in carrier type is exclusively due to physisorption/desorption of water on the surface and not through a chemical reaction. Reversibility of the carrier type upon exposure of the film to atmospheric water further confirms this hypothesis as the CNP was seen to shift back to the right after exposing the HG-Sq sample to deionized water and subsequently measuring ρ versus $V_g$.

We investigated ρ versus T in the 50 K to 375 K range for the two different D/G ratios, and at various $V_g$. FIGS. 2(c) and 3(b) show that ρ for each hydrogenated device changes sharply about the CNP with decreasing T, but that this change is not as severe when $V_g$ is swept further away from the CNP. This semi-insulating behavior fits well to the two dimensional Variable Range Hopping (VRH) theory described by equation (3), which is demonstrated in FIG. 2d for the device with a D/G ratio of 3.9 (HG-Sq). The inset in FIG. 2(d) plots the characteristic exponents $T_o$, found from the fit to the VRH theory, as a function of $V_g$, and is well fitted by a Lorentzian model. The values for $\rho_o$ found from the VRH fit had a mean value of 5,982 Ω/sqr and deviated from this value by no more than 20%.

$$\rho = \rho_o e^{\left(\frac{T_o}{T}\right)^{1/3}} \quad (3)$$

Figure 4:
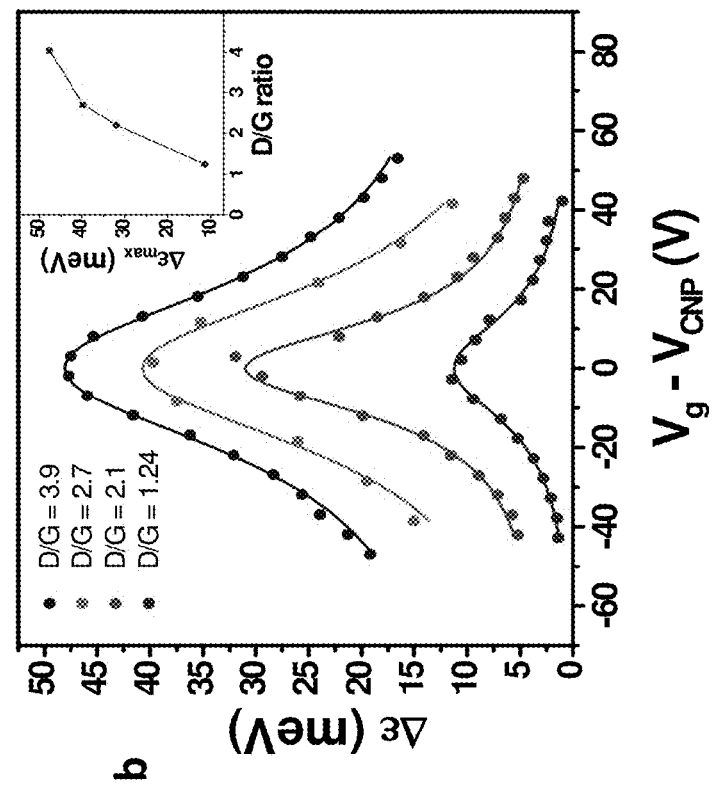
FIG. 4 illustrates Bandgap opening in hydrogenated graphene. (a) $-Ln(1/r)$ versus $\frac{1}{2}KBT$ for the high temperature data in FIG. 2d. The bandgap for a homogenous semiconductor is the slope of the curve. (b) Bandgap De versus $V_g$ for the two different hydrogenated devices with D/G ratios of 3.9 (HG-Sq) and 2.1 (HG-X2). Solid curves are Lorentzian fits to the data.
Figure 4:
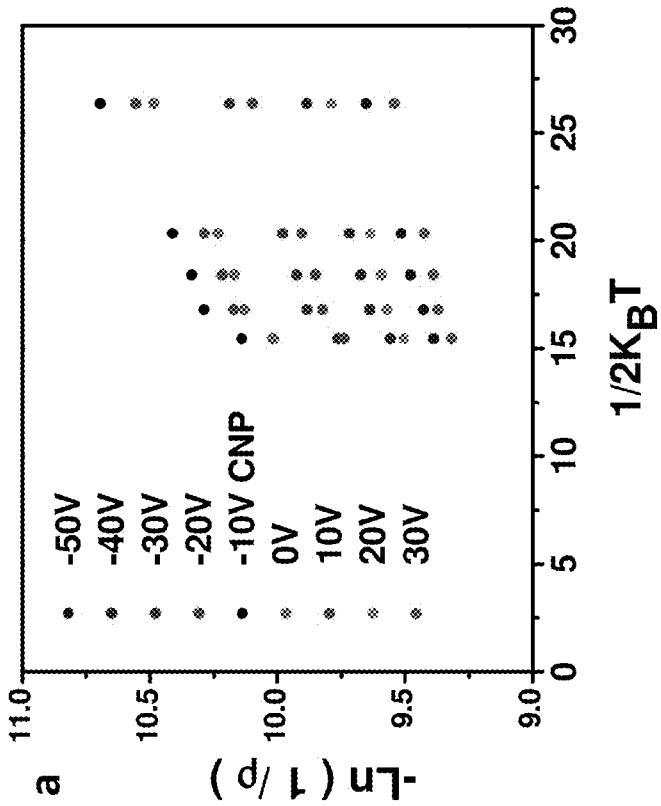

Changes in ρ as a function of T (Δρ/ΔT) increased with increasing levels of hydrogenation and suggest the opening of a bandgap, Δ∈. An estimate of Δ∈ is deduced from the T dependence of the intrinsic conductivity τ(1/ρ), which for a homogeneous semiconductor varies exponentially as shown in equation (4). FIG. 4(a) plots the logarithmic behavior σ versus ½$K_B$T where the slope of the line should be proportional to the bandgap.

$$\sigma \propto e^{\frac{-\Delta\varepsilon}{2kT}} \quad (4)$$

We find for each hydrogenated sample that the maximum bandgap occurs at the CNP and decreases with $V_g$ away from the CNP, as seen in FIG. 4(b). Furthermore, based upon the data in FIG. 4(b) we conclude that a larger D/G ratio in the Raman spectra, and therefore a higher concentration of hydrogen atoms adsorbed to the graphene, will lead to a larger bandgap opening at the CNP. Although a maximum Δ∈ of ~50 meV is measured in our lightly hydrogenated devices, we note that this is not a limit as the calculated bandgap for hydrogenated graphene increases up to 5.4 eV as you increase the hydrogen coverage. We determine that the on/off ratio (the ratio of the low vs. high resistance points in the R vs. $V_g$ plots) remains virtually fixed for graphene, but increases with decreasing temperature for hydrogenated graphene. For the data shown in FIG. 2(c) the ratios of the two materials are approximately equivalent at 50K, with the hydrogenated graphene on/off ratio increasing further with decreasing temperature. The fact that the on/off ratio for hydrogenated graphene is still low at room temperature could be the result of the creation of a small bandgap (~50 meV) and/or transport channels that are manifested within the bandgap.

DFT calculations have been carried out within the plane-wave pseudo-potential approximation and indicate that for free standing films (graphene, partially hydrogenated graphene, and partially hydrogenated graphene with water without accounting for substrate effects) there is a negligible bandgap, which has been further confirmed by orbital-based DFT calculations that yield the same conclusion. Also, the zero-bandgap in graphene has been shown to be very robust toward deformation and stress, so that the stress induced by the substrate (which should be higher upon hydrogenation) does not account for the bandgap either. We conclude that the observed bandgap can be attributed to one or a combination of the following factors: (a) long-range disorder, (b) the large electric fields that a positively charged substrate such as thermal oxide would exert on the films, and (c) the electron density depletion/increase induced by the difference in WF between substrate and film.

The ability to control the majority carrier type while introducing a bandgap makes hydrogenated graphene a promising method for nanocircuit design (e.g. p-n junctions) in a graphene-based system. Tunability of the carrier type via surface doping removes the requirement for multiple gate electrodes for independent carrier type control, avoiding the need for high quality dielectrics that are difficult to achieve on graphene and are susceptible to leakage currents. Our work also demonstrates how surface adsorbates can affect the electrical properties of hydrogenated graphene, properties that would otherwise be negligible in bulk materials.

EXAMPLES

The graphene devices listed in Table 1 were fabricated by mechanical exfoliation of HOPG on a $SiO_2$ (275 nm)/Si (n-type arsenic doped) substrate, followed by the deposition of Cr (10 nm)/Au (50 nm) contact electrodes. For devices that required additional geometrical patterning a low power $O_2$ plasma treatment was used to etch the film into the desired shape. Hydrogenation of the graphene was performed according to under the following conditions: 15-30 W, 1.5 Torr $H_2$, 100 sccm, 32° C., for 15-30 seconds. The hydrogenation conditions (time and power) varied depending upon the desired level of hydrogenation. Raman spectroscopy was used to determine the relative defect densities in the films by a ratio of the G-mode intensity (1588 cm$^{-1}$, $E_{2g}$ phonon mode) and the D-mode intensity (1345 cm$^{-1}$, appearing due to symmetry breaking at defect sites). The D/G ratio is related to the defect-free domain size of graphitic materials, in this case caused by hydrogen addition to the graphene sheet. With the reactor conditions stated, the resulting D/G ratios demonstrated saturation for each power/time and were repeatable for all devices. Raman spectra were collected using a Renishaw MicroRaman Spectrometer with a 514 nm laser excitation.

TABLE 1

Properties of graphene (G), hydrogenated graphene (HG), and hydrogenated graphene with water adsorbates (HG + W) for the four different samples X1, Sq, X2, and Hb.

| Sample | D/G ratio | CNP (V) | Carrier type | $\rho_{max}$ (at room T) |
|---|---|---|---|---|
| G-X1 | 0 | 1 | p | 4,100 Ω/sqr |
| HG-X1 + W | 0.67 | 6 | p | 6,800 Ω/sqr |
|  | 1.68 | 21 | p | 16,100 Ω/sqr |
|  | 2.94 | 34 | p | 43,300 Ω/sqr |
| HG-X1 | 2.94 | −13 | n | 51,000 Ω/sqr |
| G-Sq | 0 | 10 | P | 3,500 Ω/sqr |
| HG-Sq | 3.9 | −11 | n | 33,300 Ω/sqr |
| G-X2 | 0 | 30 | p | 4,200 Ω/sqr |
| HG-X2 | 2.1 | 9 | p | 15,500 Ω/sqr |
| G-Hb | 0 | 6 | p | 1,100 Ω |
| HG-Hb | 1.24 | −6.4 | n | 2,500 Ω |
|  | 2.7 | −10.3 | n | 4,600 Ω |

Electronic transport measurements were carried out in a cryogenic probe station, using AC lock-in techniques at a frequency of 13.7 Hz. A four-wire configuration is used in all of our measurements, as seen in FIG. 1a. An excitation current of 10 nA was used for the hydrogenated devices (I=31.6 nA for pristine graphene) and the voltage drop across the device was monitored and kept below $K_B$ T/e to prevent charge carrier heating, where $K_B$ is the Boltzmann constant and e the fundamental unit of electric charge. ρ for each device is found using equation (1), where $I_{ab}$ is the source current along one edge of the sample and $V_{cd}$ the voltage drop measured across the opposite edge (except for the Hall bar device G-Hb, in which case ρ is calculated from the resistance R via ρ=RW/L, where W and L are sample width and length, respectively).

$$\rho = \frac{\pi}{\ln 2} \cdot \frac{1}{4}\left(\frac{V_{43}}{I_{12}} + \frac{V_{14}}{I_{23}} + \frac{V_{21}}{I_{34}} + \frac{V_{32}}{I_{41}}\right) \quad (1)$$

The Hall mobility of the charge carriers (μ) is calculated using equation (2), where the Hall resistance ($R_H$) and ρ were measured in a field of 220 mT. The values for the hydrogenated graphene were measured after the CNP had stopped shifting to the left in $V_g$, which under vacuum suggests that the majority of the water had been desorbed from the film's surface.

$$\mu = \frac{|R_H|}{\rho} \quad (2)$$

Tunability of the majority carrier type via surface doping removes the requirement for multiple gate electrodes for independent carrier type control, avoiding the need for high quality dielectrics that are difficult to grow on graphene and are susceptible to leakage currents. The additional capability of being able to introduce a bandgap in graphene materials, in parallel to controlling the majority carrier type, makes hydrogenated graphene a promising method for nanocircuit design in a graphene-based system.

The method disclosed herein is superior to the prior art, solves long-standing problems, and provides several new advantages. For example, bilayer graphene and top-gated single layer graphene structures provide only a small bandgap or no bandgap. Fluorinated graphene may have bandgaps, however, it is not a tunable process. Here, the method provides a larger bandgap that is tunable and reversible, which offers unique benefits.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A graphene compound made from the method of preparing graphene flakes or chemical vapor deposition grown graphene films on a $SiO_2$/Si substrate; exposing the graphene flakes or the chemical vapor deposition grown graphene film to hydrogen plasma; performing hydrogenation of the graphene; wherein the hydrogenated graphene has a majority carrier type; creating a bandgap from the hydrogenation of the graphene; applying an electric field to the hydrogenated graphene; tuning the bandgap;

controlling the majority carrier type via surface adsorbates;

attaching by physisorption the surface adsorbates to the hydrogenated graphene; converting the majority carrier type from electrons to holes using the surface adsorbates; converting the majority carrier type from n-type to p-type;

removing the surface adsorbates; preserving the hydrogenated graphene band structure; and converting the majority carrier type from p-type to n-type.

2. A graphene compound comprising hydrogenated graphene with a bandgap and exhibiting n-type nature wherein the bandgap is tunable with an electric field effect and wherein the hydrogenated graphene has a majority carrier type and a bandgap created from the hydrogenation of the graphene and wherein an electric field applied to the hydrogenated graphene tunes the bandgap;

wherein the majority carrier type is controlled via surface adsorbates;

wherein the bandgap is higher for higher hydrogen to carbon H/C ratios; and wherein the bandgap has a maximum value at the charge neutrality point (CNP).

3. A graphene compound comprising hydrogenated graphene with a bandgap and exhibiting n-type nature further including surface adsorbates physisorbed to the hydrogenated graphene wherein the surface adsorbates are water and results in a p-type material wherein the hydrogenated graphene is formed by the process of preparing exfoliated graphene flakes or a chemical vapor deposition (CVD) grown graphene film on a $SiO_2$/Si substrate, depositing contact electrodes on the exfoliated graphene flakes or the CVD grown graphene films, exposing the exfoliated graphene flakes or the chemical vapor deposition grown graphene film to hydrogen plasma, hydrogenating the exfoliated graphene flakes or the CVD grown graphene films, creating a bandgap from the step of hydrogenating the graphene, applying an electric field to the hydrogenated graphene, and tuning the bandgap;

wherein the contact electrodes are Cr/Au contact electrodes and the hydrogenating is performed with 15-30 W, 1.5 Torr $H_2$, 100 sccm $H_2$, 32 C, for 15-30 seconds.

* * * * *